United States Patent [19]
Hiruta et al.

[11] Patent Number: 6,094,057
[45] Date of Patent: Jul. 25, 2000

[54] BOARD FOR EVALUATING THE CHARACTERISTICS OF A SEMICONDUCTOR CHIP AND A METHOD FOR MOUNTING A SEMICONDUCTOR CHIP THEREON

[75] Inventors: Yoichi Hiruta, Kashiwa; Chiaki Takubo, Tokyo, both of Japan

[73] Assignee: Kabushiki Kaisha Toshiba, Kawasaki, Japan

[21] Appl. No.: 08/730,816

[22] Filed: Oct. 17, 1996

[30] Foreign Application Priority Data

Oct. 20, 1995 [JP] Japan .................................... 7-272569

[51] Int. Cl.[7] ............................. G01R 1/073; G01R 31/02
[52] U.S. Cl. .............................................. 324/755; 439/71
[58] Field of Search .................................... 324/755, 758, 324/754; 439/68, 71, 266

[56] References Cited

U.S. PATENT DOCUMENTS

| | | | |
|---|---|---|---|
| 4,329,642 | 5/1982 | Luthi et al. | 324/755 |
| 4,620,761 | 11/1986 | Smith et al. | 439/71 |
| 4,783,719 | 11/1988 | Jamison et al. | 439/68 |
| 5,088,190 | 2/1992 | Malhi et al. | 439/68 |
| 5,320,550 | 6/1994 | Uratsuji et al. | 439/266 |
| 5,374,197 | 12/1994 | Uratsuji | 439/71 |
| 5,493,237 | 2/1996 | Volz et al. | 324/755 |
| 5,557,212 | 9/1996 | Isaac et al. | 324/755 |
| 5,748,007 | 5/1998 | Gaschke | 324/755 |
| 5,767,689 | 6/1998 | Tokuno et al. | 324/754 |
| 5,923,179 | 7/1999 | Taylor | 324/755 |

*Primary Examiner*—Ernest Karlsen
*Attorney, Agent, or Firm*—Finnegan, Henderson, Farabow, Garrett & Dunner, L.L.P.

[57] ABSTRACT

A board body constituting a characteristic evaluation board has a holding section for holding a semiconductor chip therein. The semiconductor chip has a plurality of bumps. The respective bumps of the semiconductor chip are set in contact with corresponding electrodes with the semiconductor chip held in the holding section in the board body. Clamping mechanisms are located on the surface of the board body in the neighborhood of the holding section. The clamping mechanisms press the semiconductor chip held in the holding section. The respective bumps on the semiconductor chip are pressure contacted with the corresponding electrodes. Since the respective bumps are pressure contacted with the corresponding electrodes without using a solder, the respective bumps can be formed of an eutectic solder. The semiconductor chip held in the holding section can readily be taken out of the holding section by opening the clamping mechanisms.

6 Claims, 3 Drawing Sheets

BOARD FOR EVALUATING THE CHARACTERISTICS OF A SEMICONDUCTOR CHIP AND A METHOD FOR MOUNTING A SEMICONDUCTOR CHIP THEREON

BACKGROUND OF THE INVENTION

1. Field of the Invention

The present invention relates to a board for evaluating the characteristics of, for example, a semiconductor device and a method for mounting a semiconductor device thereon.

2. Description of the Related Art

The semiconductor chips are evaluated, by a characteristic evaluation apparatus, for its electric characteristics and, then, a semiconductor chip of given characteristics is mounted on an electronic apparatus. Where the characteristics are evaluated on the characteristic evaluation apparatus, the semiconductor chip is mounted on a carrier for testing. The carrier is mounted in a socket of a characteristic evaluation board connected to the characteristic evaluation apparatus.

In FIGS. 7, 8 and 9, reference numeral 1 shows a semiconductor chip; 2, a carrier for testing; and 3, a board for characteristic evaluation. In the carrier 2 for testing, a plurality of interconnect lines 5 are formed on the upper surface of a substrate 4. The upper surface of the respective interconnect line 5 is covered with a solder resist film 7. Of the respective interconnect lines, those exposed from the solder resist film 7 serve as an electrode 6. Respective bumps 11 on the semiconductor chip 1 are placed on respective electrodes 6 and fixedly bonded by an eutectic solder 8 to the respective electrodes. A connection electrode, not shown, is provided on the testing carrier 2 and connected to the electrode 6.

FIG. 8 shows the structure of the bump 11 and a pad 13 made of aluminum is provided on the rear surface of the semiconductor chip 1. The pad 13 is exposed at an opening of an insulating film 12 and the bump 11 is bonded to the pad 13. The bump 11 is comprised of a high melting point solder and so formed as to have a substantially semi-spherical configuration.

FIG. 9 shows a board for characteristic evaluation. A socket 10 is fixed to a board body 9 of the characteristic evaluation board 3. The testing carrier 2 is bonded to the socket 10. Socket electrodes, not shown, are provided on the socket 10 and connected to a connection electrode, not shown, of the testing carrier 2. These socket electrodes are connected to interconnect circuit lines, not shown, provided on the board body 9.

For the evaluation to be made for the characteristics of the semiconductor chip, the semiconductor chip 1, as an evaluation object is mounted on, and bonded to, the testing carrier 2. As shown in FIG. 8, the bump 11 is bonded to the electrode 6 of the testing carrier by the eutectic solder 8.

Thereafter, the testing carrier 2 with the semiconductor chip 1 bonded thereto is mounted in the socket 10 of the board 3 for characteristic evaluation. The bumps 11 of the semiconductor chip 1 and the electrodes of the interconnect circuit lines on the characteristic evaluation board 3 are electrically connected via the testing carrier 2 and socket 10. In this state, the characteristic of the semiconductor chip 1 is evaluated by a characteristic evaluation apparatus.

After the completion of the evaluation, the semiconductor chip 1 is removed away from the electrode 6 of the testing carrier 2 by melting the eutectic solder 8. The semiconductor chip 1 of desirous characteristics, being so removed, is mounted on a predetermined electronic apparatus and, again, the bump 11 is soldered to the corresponding electrode of the electronic apparatus.

The semiconductor chip 1, being evaluated for its characteristics, is mounted on the electronic apparatus and, for this reason, it is necessary that the semiconductor chip 1 is readily removed from the testing carrier 2. The bump 11 is bonded by the eutectic solder 8 to the corresponding electrode. This is the reason why the bump 11 has to be formed by a solder higher in melting point than the eutectic solder 8. Such a higher melting point solder is poor in wettability compared with the eutectic solder and is are readily liable to be damaged by a thermal stress at its interfacial area. For this reason, it is desirable to form the bumps by the eutectic solder of an excellent characteristic to be mounted on the apparatus, etc. It has been difficult, however, to form such a bump by an eutectic solder.

In the structure as set out above, the testing carrier 2 and socket 10 are necessary for the semiconductor chip 1 to be mounted on the characteristic evaluation board. For this reason, more component parts are required. Since it is necessary to solder the semiconductor chip 1 to the testing carrier and, after evaluation, remove the solder, more operation steps are required. Further, the testing carrier 2 and socket 10 greater in size than the semiconductor chip 1 are required for the semiconductor chip 1 to be mounted on the characteristic evaluation apparatus. As a result, the efficiency with which the chip is mounted on the characteristic evaluation apparatus is lowered.

SUMMARY OF THE INVENTION

It is accordingly the object of the present invention to provide a characteristic evaluation board for a semiconductor chip which can form bumps on a semiconductor chip with the use of an eutectic solder, achieve less number of operation steps for characteristic evaluation and improve the efficiency with which the semiconductor chip can be mounted on a characteristic evaluation apparatus.

One object of the present invention is achieved by a board for evaluating the characteristics of a semiconductor chip, comprising:

a board body having a holding section for holding a semiconductor chip with a plurality of bumps formed thereon;

a plurality of electrodes arranged in the holding section and adapted to make contact with the bumps of the semiconductor chip; and clamping members located on the surface of the board body in the neighborhood of the holding section and adapted to press the semiconductor chip held in the holding section.

Another object of the present invention is achieved by a method for mounting a semiconductor chip on a characteristic evaluation board, comprising the steps of:

holding a semiconductor chip which has a plurality of bumps of an eutectic solder in a holding section provided in a board body, a plurality of electrodes being arranged in the holding section and being adapted to make contact with corresponding bumps; and clamping the semiconductor chip which is held in the holding section by the clamping members located on the board body to allow the bumps to be pressed into contact with the corresponding electrodes under the urging forces of the clamping members.

According to the present invention, the semiconductor chip as an object to be evaluated is held in the holding section in the board body and is fixed relative to the board body by the clamping mechanisms. Since the semiconductor chip as an object to be evaluated need not be bonded by a solder to the evaluation board, the bumps of the semiconductor chip can be formed with the use of an eutectic solder. For this reason, when the semiconductor chip is mounted on the electronic apparatus after the characteristics have been evaluated on the electronic apparatus, a soldered area can be prevented from being damaged by thermal stress involved.

Since the semiconductor chip need not be mounted on the evaluation board with the use of the solder, it is possible to readily mount and remove the semiconductor chip on and from the evaluation board and to achieve less number of operation steps involved.

Further, where the semiconductor chip is mounted on the evaluation board, it is not necessary, unlike the prior art, to use any test carrier and socket greater than the semiconductor chip. The clamping mechanism is made smaller in size and it is only necessary to provide a somewhat greater space than the semiconductor chip so that the clamping mechanism may be mounted on the evaluation board. According to the present invention, therefore, it is possible to improve the efficiency with which the semiconductor chip is mounted on the characteristic evaluation apparatus.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
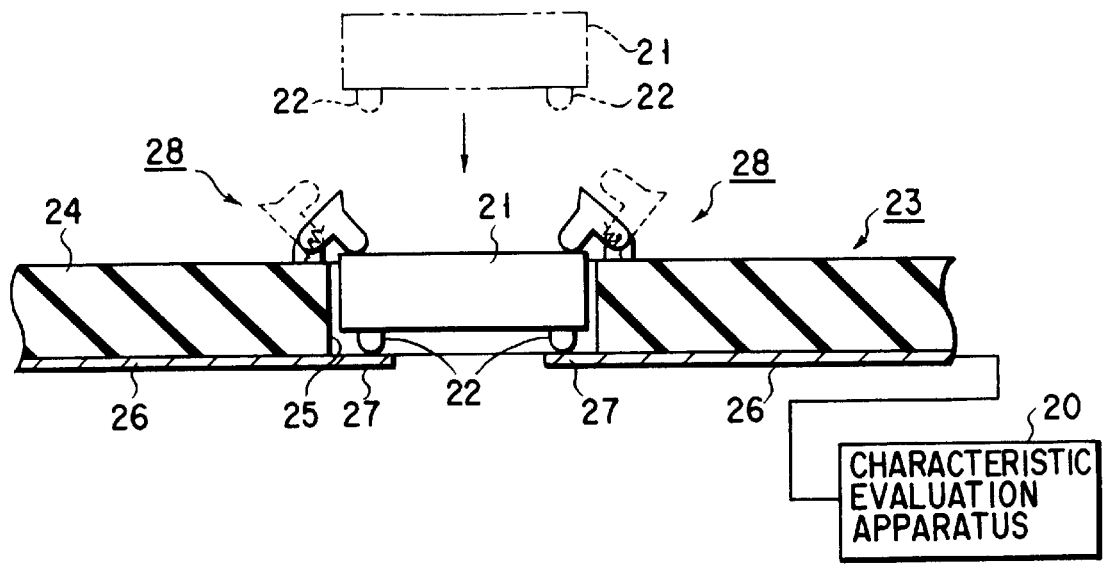
FIG. 1 is a cross-sectional view, partly taken away, showing a semiconductor chip and characteristic evaluation board in a first embodiment of the present invention.
Figure 2:
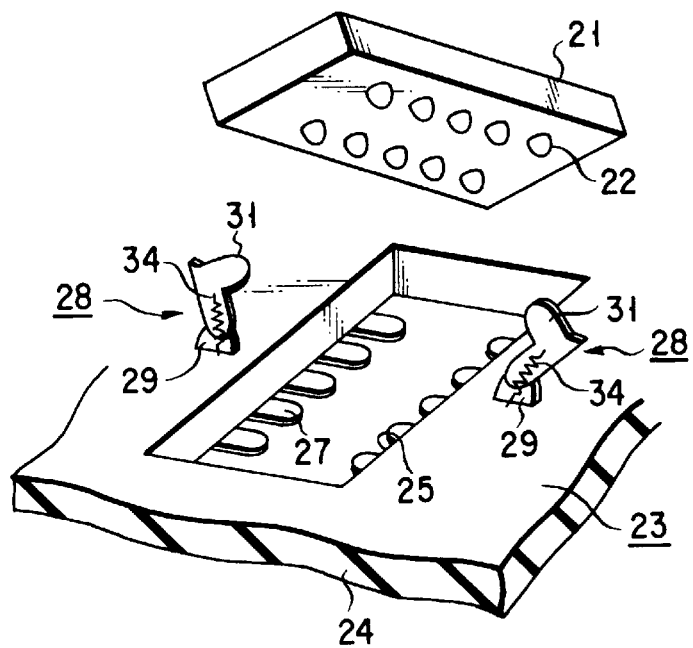
FIG. 2 is a perspective view showing the mounting process of the semiconductor chip in FIG. 1.

The embodiments of the present invention will be explained below with reference to the accompanying drawings.

FIGS. 1 to 4 show a first embodiment of the present invention. In FIGS. 1 to 4, a semiconductor chip 21 to be evaluated for its characteristics is formed to have, for example, a rectangular parallele-piped configuration. The semiconductor chip 21 has a plurality of arrays of bumps 22 on its rear surface along its longitudinal direction. These bumps 22 are formed of, for example, an eutectic solder and are substantially semi-spherical in configuration.

In a characteristic evaluation board 23, a board body 24 has a holding section 25 to hold the semiconductor chip 21 therein. The holding section 25 penetrates the board body 24 and has a size somewhat greater than the outer surface of the semiconductor chip 21. A plurality of interconnect circuit lines 26 are provided on the rear surface of the board body 24 and connected to a characteristic evaluation apparatus 20. The respective interconnect circuit line has an electrode 27 extending toward an inside of the holding section 25. The semiconductor chip 21, being held in the holding section 25, has its bumps 22 set in contact with the corresponding electrodes 27.

Clamping mechanisms 28, 28 are provided on the surface of the board body 24 at those places near the mutually parallel side edge portions of the holding section 25. These clamping mechanisms 28, 28 are of the same structure and only one clamping mechanism 28 will be explained below for brevity sake.

Figure 3A:
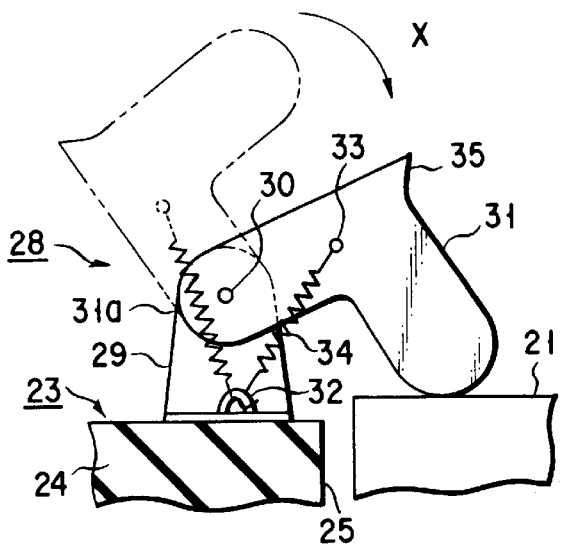
FIG. 3A is a front view showing one form of clamping mechanism shown in FIGS. 1 and 2.
Figure 3B:
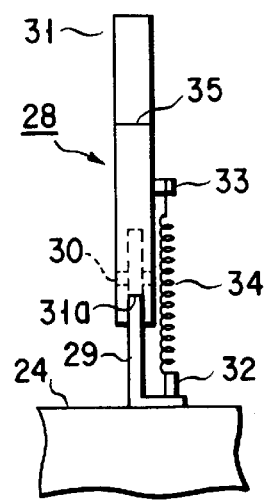
FIG. 3B is a side view in FIG. 3A.

The clamping mechanism 28 mainly comprises, as shown in FIGS. 3A and 3B, a support member 29, a pressing member 31 and a coil spring 34. The support member 29 is fixed on the board body 24. The pressing member 31 is substantially L-shaped and has its one end portion mounted on the support member 29 such that it is swingable around a pin 30. The other end of the pressing member 31 acts as the pressing section. The other end side of the pressing member, being rotated in a direction X in FIG. 3A, is allowed to be moved into the holding section 25 of the board body 24. One end portion of the coil spring 34 is anchored to a first anchoring area 32 provided on a mounting section of the support member 29 and the other end side of the coil spring 34 is anchored to a second anchoring section 33 at the middle area of the pressing member 31. An operation projection 35 is provided at a middle area of the pressing member 31 and a stopper section 31a is provided on one end side of the support member 29 to allow it to abut against the support member 29.

In the structure as set out above, when the operation projection 35 of the pressing member 31 is operated against an urging force of the coil spring 34, the pressing member 31 is swung, in toggle motion, about a pin 30 as indicated by a solid or a broken line in FIG. 3A. When the semiconductor chip 1 is to be set in the characteristic evaluation board 23, the pressing member 31 of the clamping mechanism 28 is swung to an open position as indicated by the broken line in FIG. 3A and, in that position, a stopper section 31a is abutted against the support member 29 and stopped to this position. In this state, the semiconductor chip 21 as an object to be evaluated is held in the holding section 25. Thereafter, the operation projection 35 is operated and the pressing member 31 is swung, in a direction of an arrow X in FIG. 3A, against the urging force of the coil spring 34. As a result, the other end side of the pressing member 31 is set in contact with the surface of the semiconductor chip 21. The semiconductor chip 21 is pressed under the urging force of the coil spring 34 to allow the bumps 22 to be contacted with the electrodes 27. In this state, the semiconductor chip 21 has its characteristics evaluated on the characteristic evaluation apparatus.

After the completion of the characteristic evaluation, the operation projection 35 is operated and, under the urging force of the coil spring 34, the pressing member 31 is swung to an open position as indicated by the broken line in FIG. 3A. The semiconductor chip 21, being evaluated for characteristics, is taken out of the holding section 25 and transferred to another position.

According to the above-mentioned embodiment, the holding section 25 is provided in the board body 24, the semiconductor chip 21 is set in the holding section 25 as the object to be evaluated and the semiconductor chip 21 is set by the clamping mechanisms 28 relative to the board body 24. Since it is not necessary to bond the semiconductor chip, as an object to be evaluated, to the characteristic evaluation board as in the prior art, the bumps of the semiconductor chip can be formed of an eutectic solder. Where the semiconductor chip is mounted on the electronic apparatus after the evaluation has been made for its characteristics, the eutectic solder can be bonded under a better condition to the electrodes on the electronic apparatus, so that the soldered area is prevented from being damaged due to the thermal stress involved.

Further, since it is not necessary to bond the semiconductor chip to the characteristic evaluation board by the solder, it is easier to mount the semiconductor chip in the characteristic evaluation board and remove it. It is, therefore, possible to reduce the operation steps involved.

Further, unlike the prior art, the testing carrier and socket greater than the semiconductor chip are not necessary in the case where the semiconductor chip is mounted in the characteristic evaluation board. The clamping mechanism is smaller in size and it is only necessary that a somewhat greater space than the semiconductor chip be taken for the clamping mechanisms to be located on the board body. It is, therefore, possible to improve the mounting efficiency with which the semiconductor chip is mounted in the characteristic evaluation apparatus.

Figure 4:
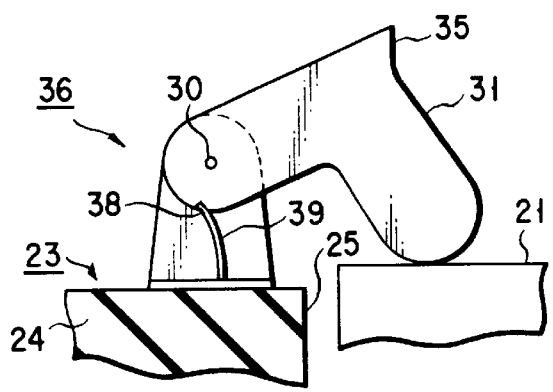
FIG. 4 is a front view showing another form of clamping mechanism.

FIG. 4 shows another form of clamping mechanisms. In the clamping mechanism 36 as shown in FIG. 4, the same reference numerals are employed to designate parts or portions corresponding to those shown in FIGS. 3A and 3B. An explanation of these is limited to different portions only.

Although, in the clamping mechanism 28 shown in FIGS. 3A and 3B, the coil spring 34 has been explained as being an elastic member, a leaf spring 39 is used as the elastic member in the clamping mechanism 36.

One end of the leaf spring 39 is fixed to the mounting section of a support member 29 and the other end contacts a pressing member 31. By doing so, the clamping mechanism 36 can perform the same function as that of the above-mentioned clamping mechanism 28.

Figure 5:
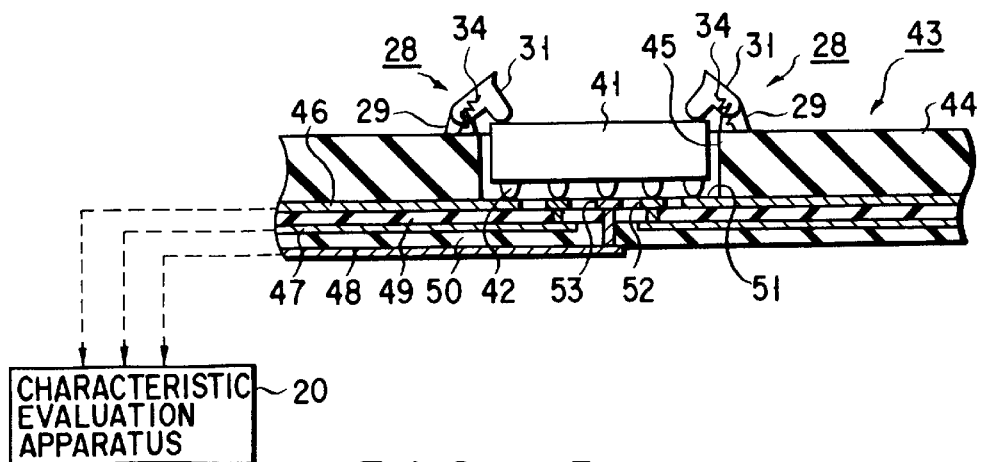
FIG. 5 is a cross-sectional view, partly taken away, showing a semiconductor chip and characteristic evaluation board in a second embodiment of the present invention.
Figure 6:
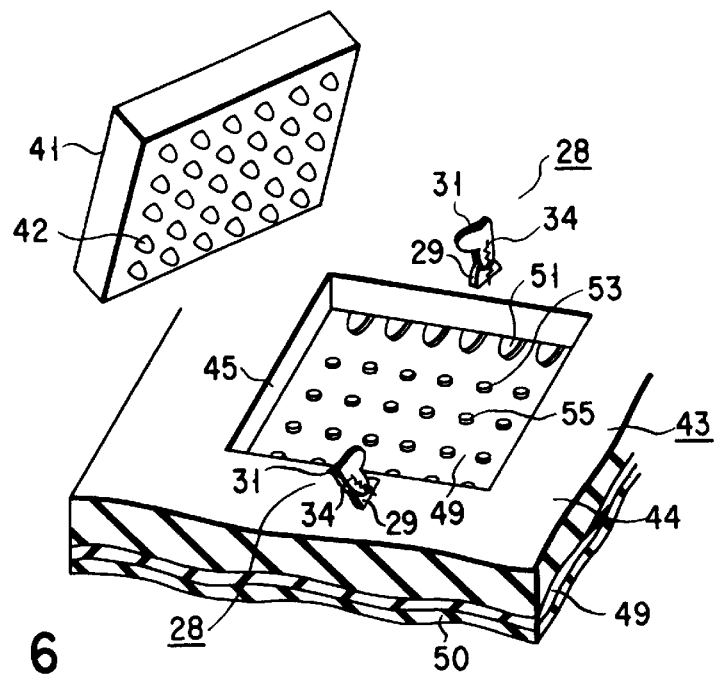
FIG. 6 is a perspective view showing the mounting process of a semiconductor chip in FIG. 5.
Figure 7:
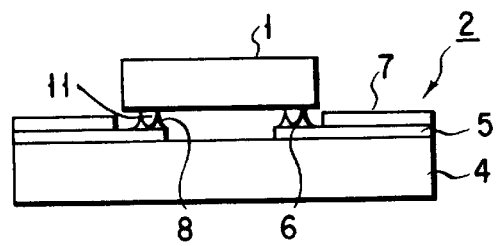
FIG. 7 is a side view showing the state in which a semiconductor chip is mounted on a conventional testing carrier.
Figure 8:
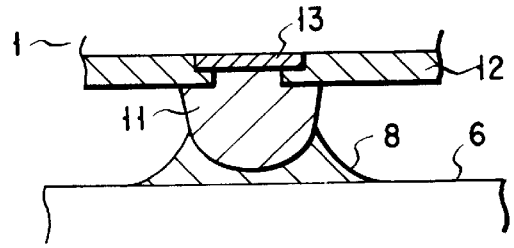
FIG. 8 is a cross-sectional view showing one of those bumps in FIG. 7.
Figure 9:
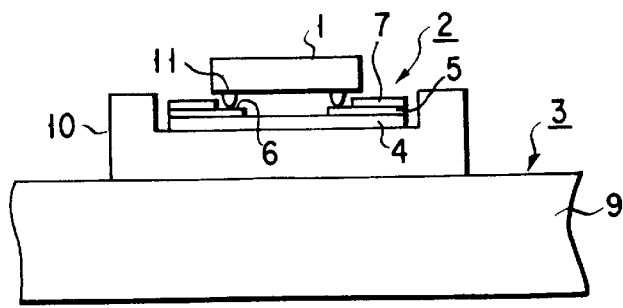
FIG. 9 is a side view showing the testing carrier of FIG. 7 mounted on a characteristic evaluation board.

FIGS. 5 and 6 show a second embodiment of the present invention and the application of the present invention to a semiconductor chip of an area array package. FIG. 5 is a cross-sectional view showing the mounting state of the semiconductor and FIG. 6 is a perspective view showing one mounting process.

In FIGS. 5 and 6, a semiconductor chip 41 as an object to be evaluated is of a rectangular parallelepiped type. A plurality of bumps 42 are provided on the whole rear surface of the semiconductor chip. These bumps 42 are composed of, for example, an eutectic solder and are each of substantially semispherical in configuration.

A characteristic evaluation board 43 has interconnect lines of a multi-layer structure. A board body 44 constituting the board 43 has a holding section 45 to hold the semiconductor chip therein. The holding section 45 has a size somewhat greater than that of the semiconductor chip 41. First, second and third interconnect circuit lines 46, 47 and 48 are provided on the rear surface side of the board body 44 and connected to the characteristic evaluation apparatus 20. A first insulating layer 49 is formed between the first interconnect circuit line 46 and the second interconnect circuit line 47, and a second insulating layer 50 is formed between the second interconnect circuit line 47 and the third interconnect circuit line 48. The first insulating layer 49 constitutes a base portion of the holding section 45. First, second and third electrodes 51, 52 and 53 are arranged on the insulating layer 49. The first electrodes 51 are connected to the first interconnect circuit line 46; the second electrodes 52 to the second interconnect circuit line 47 via the first insulating layer 49; and the third electrode 53 to the third interconnect circuit line 48 via the first and second insulating layers 49 and 50. With the semiconductor chip 41 held in the holding section 45, the bumps 42 are set in contact with the first to third electrodes 51, 52 and 53.

Clamping mechanisms 28, 28 are located on the surface of the board body 44 in the neighborhood of those mutually parallel side edge portions of the holding section 45. These clamping mechanisms 28, 28 are similar in construction to those as shown, for example, in FIGS. 3A, 3B and the same reference numerals are employed to designate parts or elements corresponding to those in FIGS. 3A, 3B.

Where, in the arrangement above, the semiconductor chip 41, is to be set in the holding section 45 of the board body 44, pressing members 31, 31 of the clamping mechanisms 28, 28 are in the open state as shown in FIG. 6. In the open state, the semiconductor chip 41 is inserted into the holding section 45. Thereafter, the pressing members 31, 31 are swung against the urging forces of coil springs 34 to allow the other end of each to be pressed into contact with the surface of the semiconductor chip 41. For this reason, the respective bumps 42 of the semiconductor chips 41 are set in pressure contact with the first to third electrodes 51, 52 and 53 under the urging forces of the coil spring 34. In this state, the characteristics of the semiconductor chip 41 is evaluated by the characteristic evaluation apparatus 20.

When the characteristic evaluation is ended, the spring members 31, 31 of the clamping mechanisms 28, 28 are released as shown in FIG. 6. Thereafter, the semiconductor chip 41 is taken out of the holding section 45 and mounted on an associated electronic apparatus, not shown.

According to the embodiment above, the characteristic evaluation of an area array package's semiconductor chip 41 with the bumps 42 formed on the whole rear surface thereof can be made in the same way as the first embodiment. Further, since the bumps 42 are formed of an eutectic solder, it is possible to obtain better performance in the case where the chip is mounted on the electronic apparatus after it has been evaluated for its characteristics. It is also possible to obviate the need to use any testing carrier and socket, as in the prior art, which are greater than the semiconductor chip. The clamping mechanisms are smaller in size and it is only necessary, according to the present invention, to take a somewhat greater space than that of the semiconductor chip so that the clamping mechanisms are located. Thus, the structure of this embodiment can improve mounting efficiency on the characteristic evaluation apparatus.

Further, it is also possible to apply the clamping mechanism of FIG. 4 to the second embodiment above.

Various changes or modifications can be made without departing from the spirit and scope of the present invention.

What is claimed is:

1. A board for evaluating the characteristics of a semiconductor chip, comprising:

a board body having a holding section for holding a semiconductor chip with a plurality of bumps formed thereon;

a plurality of electrodes arranged in the holding section and adapted to make contact with the bumps of the semiconductor chip;

clamping members located on the surface of the board body in the neighborhood of the holding section and adapted to press the semiconductor chip held in the holding section;

wherein each clamping member comprises a support member fixed to the board body, a pressing member having one end swingably mounted on the support member and the other end adapted to be pressed into contact with the semiconductor chip held in the holding section, and an elastic member urging the pressing member toward a swinging direction.

2. A board according to claim 1, wherein the bump is formed of an eutectic solder.

3. A board according to claim 1, wherein the elastic member is comprised of a coil spring and the coil spring has one end fixed to the board body and the other end anchored at an area between a swing center of the pressing member and said other end of the pressing member.

4. A board according to claim 1, wherein the bumps are arranged on a rear surface and along opposite sides of the semiconductor chip.

5. A board according to claim 1, wherein the bumps are arranged on a whole rear surface of the semiconductor chip.

6. A board for evaluating the characteristics of a semiconductor chip, comprising:

a board body having a holding section for holding a semiconductor chip with a plurality of bumps formed thereon;

a plurality of electrodes arranged in the holding section and adapted to make contact with the bumps of the semiconductor chip;

clamping members located on the surface of the board body in the neighborhood of the holding section and adapted to press the semiconductor chip held in the holding section;

wherein each clamping member comprises a support member fixed to the board body, a pressing member having one end swingably mounted on the support member and the other end adapted to be pressed into contact with the semiconductor chip held in the holding section, and an elastic member urging the pressing member toward a swinging direction, wherein the elastic member is comprised of a coil spring, and the coil spring has one end fixed to the board body and the other end anchored at an area between a swing center of the pressing member and said other end of the pressing member.

* * * * *